United States Patent
Hong et al.

(10) Patent No.: US 8,215,264 B2
(45) Date of Patent: Jul. 10, 2012

(54) ATOMIC LAYER DEPOSITION APPARATUS

(75) Inventors: Kyung Il Hong, Chungchungnam-do (KR); Dae Youn Kim, Daejeon (KR); Hyung-Sang Park, Seoul (KR); Sang Jin Jeong, Daejeon (KR); Wonyong Koh, Daejoen (KR); Herbert Terhorst, Amersfoort (NL)

(73) Assignee: ASM Genitech Korea Ltd. (KR)

( * ) Notice: Subject to any disclaimer, the term of this patent is extended or adjusted under 35 U.S.C. 154(b) by 0 days.

(21) Appl. No.: 13/171,899

(22) Filed: Jun. 29, 2011

(65) Prior Publication Data
US 2011/0308460 A1 Dec. 22, 2011

Related U.S. Application Data

(62) Division of application No. 11/857,294, filed on Sep. 18, 2007, now Pat. No. 7,976,898.

(30) Foreign Application Priority Data

Sep. 20, 2006 (KR) ........................ 10-2006-0091412

(51) Int. Cl.
*C23C 16/00* (2006.01)

(52) U.S. Cl. .............. 118/723 E; 118/728; 118/715; 118/723 R; 427/248.1; 427/250; 427/255.28

(58) Field of Classification Search ............... 427/248.1, 427/255.28; 118/715, 723 R, 723 E
See application file for complete search history.

(56) References Cited

U.S. PATENT DOCUMENTS

| 5,639,891 A | 6/1997 | Linker et al. |
| 5,711,811 A | 1/1998 | Suntola et al. |
| 5,730,801 A | 3/1998 | Tepman et al. |
| 5,916,369 A * | 6/1999 | Anderson et al. ............ 118/715 |
| 6,002,108 A | 12/1999 | Yoshioka |
| 6,113,984 A | 9/2000 | MacLeish et al. |
| 6,143,079 A * | 11/2000 | Halpin ......................... 118/715 |
| 6,254,933 B1 * | 7/2001 | Habuka et al. ............ 427/248.1 |
| 6,539,891 B1 * | 4/2003 | Lee et al. .................. 118/723 E |
| 6,562,140 B1 | 5/2003 | Bondestam et al. |
| 6,572,705 B1 | 6/2003 | Suntola et al. |
| 6,645,574 B1 | 11/2003 | Lee et al. |
| 6,902,624 B2 * | 6/2005 | Seidel et al. .................. 118/719 |
| 2004/0009307 A1 | 1/2004 | Koh et al. |
| 2004/0187784 A1 | 9/2004 | Sferlazzo |
| 2005/0037154 A1 | 2/2005 | Koh et al. |
| 2006/0249077 A1 * | 11/2006 | Kim et al. .............. 118/723 MP |

FOREIGN PATENT DOCUMENTS

| JP | 3048421 | 3/1991 |
| JP | 4320025 | 11/1992 |
| JP | 05047665 | 2/1993 |
| JP | 5047669 | 2/1993 |
| JP | 6291048 | 10/1994 |
| JP | 2001058898 A * | 3/2001 |
| KR | 10-0415475 | 1/2004 |

* cited by examiner

*Primary Examiner* — David Turocy
(74) *Attorney, Agent, or Firm* — Knobbe Martens Olson & Bear LLP (57) ABSTRACT

The present invention relates to an ALD apparatus, and particularly relates to an ALD apparatus that is suitable for rapidly depositing a thin film on a substrate having an actual area that is larger than a planar substrate. In the reaction chamber of the ALD apparatus according to an exemplary embodiment of the present invention, more gas is supplied to a portion where more gas is required by having differences in the space for gas to flow rather than supplying the gas in a constant flux and a constant flow velocity such that the time required for supplying reactant gases and waste of reactant gases may be minimized to increase productivity of the ALD apparatus. The ceiling of the reaction space is shaped to provide a non-uniform gap over the substrate.

11 Claims, 7 Drawing Sheets

ATOMIC LAYER DEPOSITION APPARATUS

CROSS-REFERENCE TO RELATED APPLICATIONS

The present application is a divisional of U.S. application Ser. No. 11/857,294 filed Sep. 18, 2007 and issued as U.S. Pat. No. 7,976,898, which claims priority under 35 U.S.C. §119 to Korean Patent Application No. 10-2006-0091412 filed in the Korean Intellectual Property Office on Sep. 20, 2006. Each of the priority applications is hereby incorporated by reference in its entirety.

BACKGROUND OF THE INVENTION

1. Field of the Invention

The present invention relates to an atomic layer deposition (ALD) apparatus, and particularly relates to an ALD apparatus that is suitable for rapidly depositing a thin film on a structure having a larger actual area than an apparent area, such as DRAM.

2. Description of the Related Art

In the manufacture of semiconductor devices, efforts for improving apparatuses and processes to be suitable for forming a high quality thin film on a substrate have continued. In ALD methods, separate pulses of at least two reactants are sequentially introduced on the substrate, a surface reaction of the reactants occurs to form a monolayer on the surface of the substrate, and the reactants are sequentially introduced until a desired thickness of the deposited material is deposited. In pure ALD methods, the reactants are pulsed separately, and temperatures are kept in a window above condensation and below thermal decomposition, the thin film is formed by saturative surface reactions, and thereby a thin film having a uniform thickness may be formed on the whole surface of the substrate regardless of surface roughness of the substrate and impurities in the thin film may be reduced to form a thin film having high quality.

A lateral flow ALD reaction chamber, in which gases flow laterally over and parallel to the major surface of a substrate, has been proposed. In the lateral flow ALD reaction chamber, flowing of the gases is rapid and simple and thereby high speed switching of gas supplies may be attained to reduce time required for sequentially supplying process gases. Exemplary lateral flow reaction chambers suitable for time-divided gas supply of an ALD method and a method of depositing a thin film using the lateral flow reaction chamber have been disclosed in Korean Patent Application Nos. 1999-0023078 and 2000-0033548, and U.S. Pat. No. 6,539,891. In addition, an improved example of the lateral flow reaction chamber suitable for time-divided gas supply of an ALD method and a method of depositing a thin film using the lateral flow reaction chamber have been disclosed in Korean Patent Application No. 2005-0038606 and U.S. patent application Ser. No. 11/429,533, published as U.S. Publication No. 2006-0249077 A1 on Nov. 9, 2006. Other examples of lateral flow ALD reaction chambers have been disclosed in U.S. Pat. No. 5,711,811 and U.S. Pat. No. 6,562,140. In the examples, the reaction chambers have a constant gap between the side on which a substrate is disposed and the side facing a surface of the substrate, such that gas flowing to the substrate may be constant and maintained in a state of a near laminar flow. such lateral flow reaction chambers are also referred to in the art as cross-flow or horizontal flow reaction chambers, although the orientation need not be horizontal.

A substrate with a rough surface having a plurality of protrusions and depressions has an actual surface area that is larger than a planar surface. In addition, in a dynamic random access memory (DRAM), a dielectric layer that stores charge and has a plurality of thin holes and drains may have an actual surface area of about fifty times as large as a planar substrate. Similarly, other integrated circuit patterns may have dense and/or high aspect ratio features that greatly increase surface area relative to planar surfaces.

In general, a substrate or wafer for a semiconductor integrated circuit may have a round planar shape.

If a substrate with a rough surface having an actual surface area of about fifty times as large as a planar substrate is set in a lateral flow ALD reaction chamber in which reactant gases supplied in a constant flux and a constant flow velocity, then the reactant gases supplied in a constant flux and a constant flow velocity on the substrate may be consumed in a different way relative to ALD on other substrates that do not have a rough surface. Accordingly, a gas supply of a constant flux and a constant flow velocity may not be optimal for the substrate with a rough surface having an actual surface area of about fifty times as large as a planar surface on a similar substrate, in that time required for a saturative gas supply cycle may be longer and the amount of gases required for the saturative gas supply cycle may be larger than optimally required.

Figure 1:
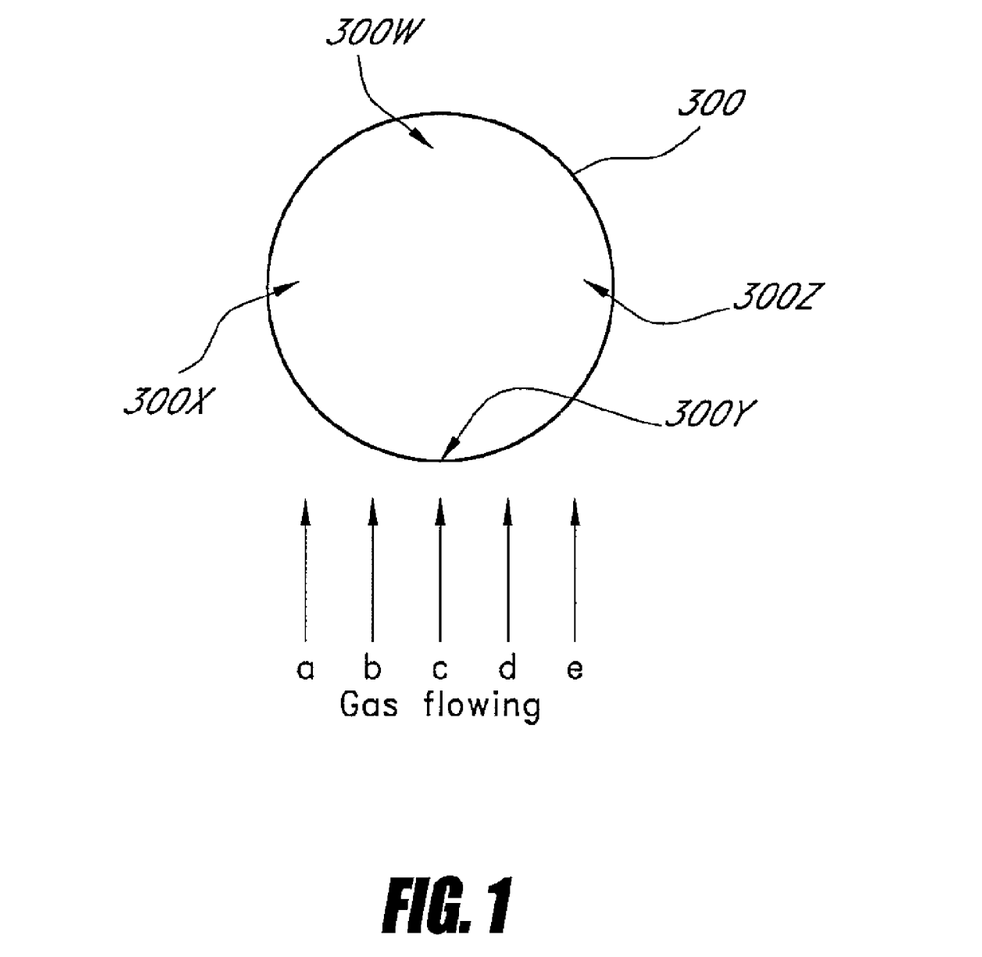
FIG. 1 is a schematic plan view representing a gas flowing in the case of a circular substrate in a lateral flow ALD reaction chamber.

In FIG. 1, a lateral flow ALD reaction chamber in which gases flow in the direction of the arrows, and a circular substrate set in the lateral flow reaction chamber, are shown schematically. Referring to FIG. 1, if the gases are supplied to the reaction chamber in a gas pulse flow in a constant flux and a constant flow velocity on the circular substrate with a rough surface having the actual surface area that is much larger than a planar substrate, portions of the gases are consumed in positions 300X, 300Y, and 300Z through adsorption or surface reaction on the surface of the substrate after portions of the gases are consumed through adsorption or surface reaction on the surface of the reaction chamber. Even though adsorption or surface reaction on the surface of the substrate in the positions 300X, 300Y, and 300Z is completed, adsorption or surface reaction on the surface of the substrate in a position 300W may not yet be completed, i.e., saturation may not be achieved. Accordingly, the gases must be supplied to the reaction chamber until adsorption or surface reaction on the surface of the substrate in a position 300W is completed. Thereby, the gases that flow on the positions 300X and 300Y after completion of adsorption or surface reaction in the positions 300X and 300Z and before completion of adsorption or surface reaction in the position 300W is excess and wasted. In other words, in order to achieve true surface saturation in all locations, full gas flow must be supplied to all locations until the last-to-saturate location is saturated.

If reactant gases have enough vapor pressure and an excess of reactant gases is supplied to the reaction chamber, these differences or different locations on the substrate may be ignored. For example, oxygen ($O_2$) gas or ozone ($O_3$) gas may be supplied at a much larger quantity compared with the minimum quantity required to form a thin film, such that differences in rates of saturation at different positions on the substrate may be ignored. However, it takes a great deal of time to supply a reactant gas having a lower vapor pressure such as tetrakis(ethylmethylamido)halfnium (TEMAHf) or tetrakis(ethylmethylamido)zirconium (TEMAZr), which are often employed to form a thin film of $HfO_2$ or $ZrO_2$. The same is true of numerous other precursors, including metal halides and metalorganics, that are suitable for ALD but have very low vapor pressures (e.g., less than about 0.1 mmHg) under standard (room temperature and atmospheric pressure) conditions.

For example, if a circular substrate having a diameter of about 300 mm and having the actual surface area about fifty times as large as a planar surface of 300 mm diameter is used, the time required for supplying the reactant gas until completion of adsorption or surface reaction on the whole surface of the substrate may be one second or more.

In addition, if the reactant gas supplied to the reaction chamber is not used to form a thin film but passes through the reaction chamber, a longer time is required for supplying the reactant gas until completion of saturative adsorption or surface reaction on the whole surface of the substrate.

Accordingly, in order to reduce the time required for supplying the reactant gas with a lower vapor pressure and/or in order to reduce the consumption of an expensive reactant gas, it is preferred that adsorption or surface reaction on the whole surface of the substrate is completed, or the surface saturated, with minimum supply of the low vapor pressure gas or the expensive gas.

The above information disclosed in this Background section is only for enhancement of understanding of the background of the invention and therefore it may contain information that does not form the prior art that is already known in this country to a person of ordinary skill in the art.

SUMMARY OF THE INVENTION

The embodiments described herein provide an ALD apparatus including a lateral flow ALD reaction chamber having advantages of reducing the time required for supplying reactant gases and waste of reactant gases in the case of using a circular substrate having an actual surface area that is much larger than a planar surface would have on a similarly sized substrate.

In one aspect, a lateral flow atomic layer deposition (ALD) apparatus in which reactant gases flow in a gas flow direction substantially parallel to a surface of a substrate includes a reaction chamber and a substrate support configured for positioning the substrate within the reaction chamber. The apparatus also includes a part of the reaction chamber facing the substrate support, with a portion depressed away from the substrate support. The substrate support and the reaction chamber part facing it define a gas flow space above the substrate that is not uniform in height across a direction perpendicular to the gas flow direction.

In another aspect, a method of conducting atomic lay deposition (ALD) includes providing a substrate in a reaction chamber. At least two ALD reactants are alternately and sequentially supplied into the reaction chamber space over the substrate in a gas flow direction parallel to the substrate, wherein the reaction space has a height over a center of the substrate greater than a height over edges of the substrate in a cross-sectional view perpendicular to the gas flow direction.

The depressed portion of the reaction chamber part may correspond to a middle portion of the substrate when positioned on the substrate support.

The maximum gap in which the reactant gas flows, between the substrate and the reaction chamber side, may be at least one and a half times larger than the minimum gap thereof.

The maximum gap in which the reactant gas flows within the reaction chamber, between the substrate and the reaction chamber side, may be at least two times larger than the minimum gap thereof.

The minimum gap in which the reactant gas flows within the reaction chamber, between the substrate and the reaction chamber side, may be about 0.5 mm to about 5 mm.

The minimum gap in which the reactant gas to flows within the reaction chamber, between the substrate and the reaction chamber side, may be about 1 mm to about 3 mm.

The maximum gap in which the reactant gas to flows within the reaction chamber, between the substrate and the reaction chamber side, may be about 2 mm to about 15 mm.

The maximum gap in which the reactant gas to flows within the reaction chamber, between the substrate and the reaction chamber side, may be about 3 mm to about 6 mm.

DETAILED DESCRIPTION OF THE PREFERRED EMBODIMENT

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

Now, an exemplary embodiment of the present invention will be described in detail with reference to accompanying drawings.

Firstly, a gas flux on a round substrate having an actual surface area that is different from a planar surface would have on the same substrate will be described with reference to FIG. 2.

Figure 2:
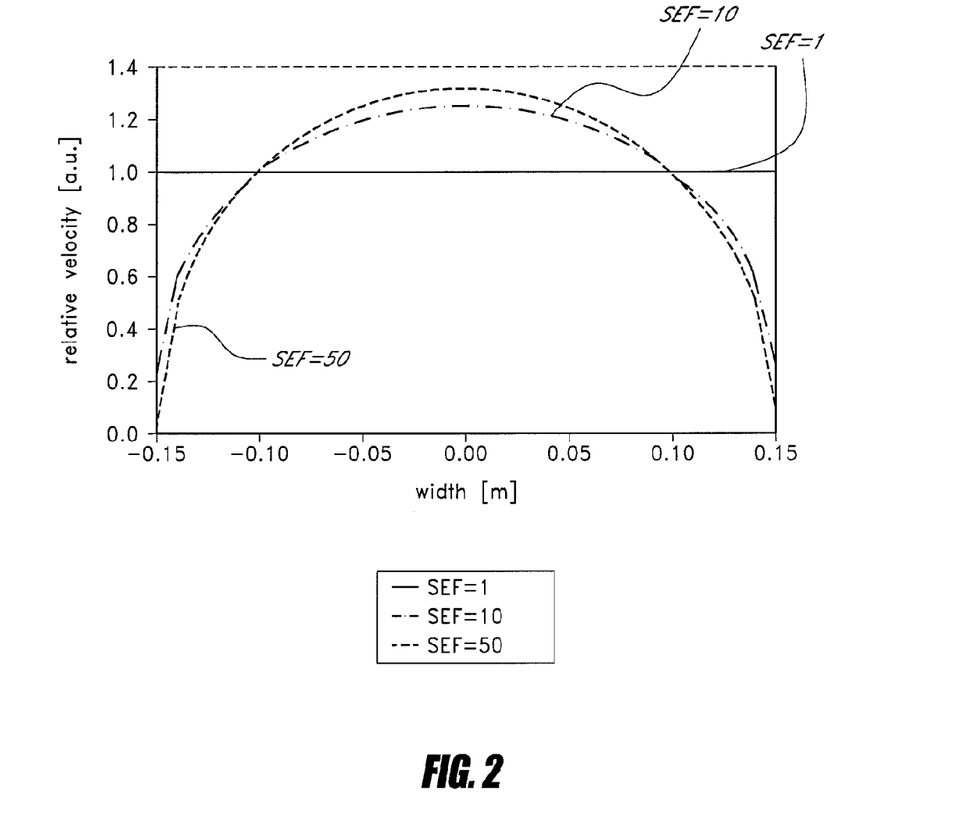
FIG. 2 is a graph representing the most suitable gas velocity for using the minimum quantity of gas in the case of a 300 mm circular substrate in a lateral flow ALD reaction chamber, as a function of position across the width of the substrate perpendicular to the direction of gas flow.

FIG. 2 is a graph representing the most suitable gas velocity for using the minimum quantity of gas in the case of a circular substrate in a lateral flow ALD reaction chamber. In FIG. 2, three cases surface enhancement factor (SEF)=1, SEF=10, and SEF=50 are represented such that the case SEF=1 represents a circular substrate having an actual surface area that is the same as a planar surface substrate, the case SEF=10 represents a circular substrate having an actual surface area that is ten times as large as a planar substrate, and the case SEF=50 represents a circular substrate having an actual surface area that is fifty times as large as a planar surface substrate. Here, the circular substrate has a diameter of about 300 mm.

If the gas is supplied in a constant flux and a constant flow velocity, adsorption or surface reaction on the reaction chamber and on the substrate may be completed by using a minimum quantity of gas, and the time required for supplying gas to form a thin film may be minimized in the case of a circular substrate having an actual surface area that is the same as a planar substrate. However, when using a circular substrate having an actual surface area that is at least ten times or fifty times as large as a planar substrate, more reactant gas should be supplied to the middle portion of the substrate. If gas velocity over the circular substrate is maintained as shown in FIG. 2, adsorption or surface reaction of the reactant gas in each position 300X, 300W, and 300Z shown in FIG. 1 can be completed simultaneously, and thus no reactant gas is wasted and the time to supply the reactant gas is minimized.

Now, a reaction chamber of an ALD apparatus according to an exemplary embodiment of the present invention will be described in detail with reference to FIGS. 3-6. It will be understood that FIGS. 3-6 represent only one example of a lateral flow, cross-flow or horizontal flow ALD reactor. The separate reactant inlets to the chamber is a structure particularly beneficial for ALD, in order to keep reactants from mixing in the vapor phase. However, the non-uniform gap described below is also beneficial for other cross-flow ALD reactor designs, such as that of U.S. Pat. No. 6,562,140, the disclosure of which is incorporated herein by reference. Accordingly, certain details of the reactor of FIGS. 3-6 are omitted in the description below. Further details are provided in U.S. Patent Publication No. 2006/0249077 A1 with reference to FIGS. 2-4 and paragraphs 27-50, the disclosure of which is hereby expressly incorporated herein by reference.

Figure 3:
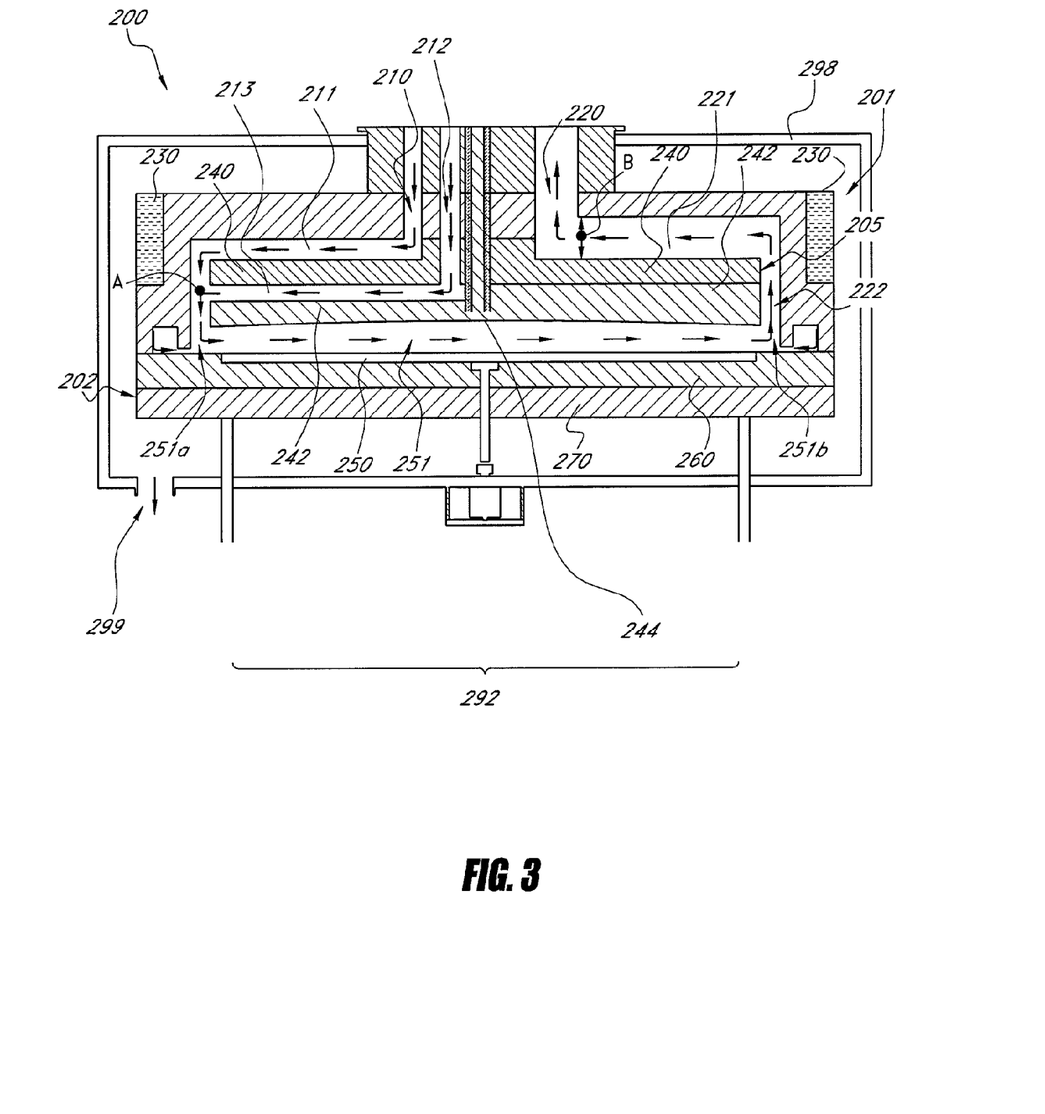
FIG. 3 is a schematic cross-sectional view of an exemplary lateral flow ALD reactor, including a plurality of reactant inlets, where a ceiling-defining member is an RF electrode under a flow control plate.

FIG. 3 illustrates an ALD reactor 200 according to one embodiment. The ALD reactor 200 includes a reactor cover 201, a reactor base 202, a reactor base driver 292, a gas flow control guide structure 205, and an outer wall 298. The reactor cover 201 and the reactor base 202 are in reversible sealing contact with each other and define a reaction chamber. The reaction chamber includes a reaction space 251 in which a substrate 250 is processed. The reaction space 251 is defined between an upper surface of the reactor base 202 and a lower surface of the gas flow control guide structure 205. The reaction space 251 includes an upstream periphery 251a into which a reactant is introduced and a downstream periphery 251b from which excess reactant and reaction by-products are exhausted. The reactor base 202 is detachable from the reactor cover 201 for loading or unloading a substrate 250. The outer wall 298 is configured to pressure-tightly house the reactor cover 201 and the reactor base 202, and can be evacuated through an outer exhaust 299 connected to a vacuum pump.

The reactor cover 201 includes first and second inlets 210 and 212, and an exhaust outlet 220. The reactor cover 201 is preferably formed of a metal. In certain embodiments, the reactor cover 201 may be formed of a ceramic material.

The first and second inlets 210 and 212 preferably extend through the top plate 203. The inlets 210 and 212 are in fluid communication with reactant sources (not shown). The first and second inlets 210 and 212 are configured to supply a first reactant X and a second reactant Y, respectively. Preferably, the reactants X and Y are introduced in vapor phase through the inlets 210 and 212. Valves may be located upstream of the inlets 210 and 212 to control the flows of the reactants and the inert gas. For example, 3-way valves can be used to switch gas supply between the inert gas and the reactants for each of the inlets 210 and 212. In addition, the ALD reactor 200 preferably includes a switching mechanism for controlling the valves. In one embodiment, a computer is programmed and used to alternate supplies of the reactants and the inert gas to achieve ALD sequences.

The reactor cover 201 also includes the cover heater 230 on outer surfaces of the reactor cover 201. The cover heater 230 is configured to resistively heat the reactor cover 201 to a predetermined temperature so as to prevent a reactant from condensing on an inner surface of the reaction cover 201.

The reactor base 202 includes a substrate holder 260 and a substrate heater 270. The substrate holder 260 is configured to support a substrate 250, and preferably has a recess to secure the substrate 250 and expose only a top surface of the substrate 250. The substrate heater 270 is integrally attached to a lower surface of the substrate holder 260, and is configured to heat the substrate 250 to a predetermined temperature, preferably below the reactants' thermal decomposition temperatures and above the reactants' condensations temperatures, during a deposition process. The substrate holder 260 is formed of a metal, and is preferably electrically grounded. A skilled artisan will appreciate that the structure and material of the reactor base 202 can be varied, depending on the design of a reactor.

The reactor base driver 292 is configured to move the reactor base 202 in a vertical direction, using a driving device (not shown) such as a motor. Before or after a deposition process, the reactor base 202 is moved down, and is detached from the reactor cover 201 so that the reaction chamber is open. The substrate 250 can be loaded or unloaded by robotics through a gate valve (not shown) in the outer wall 298.

The gas flow control guide structure 205 includes an upper gas flow control plate 240 and a lower gas flow control plate 242. As illustrated and described in more detail with respect to FIG. 4C below, the lower gas flow control plate 242 serves as a ceiling-defining member or part for the reaction space and includes a depression 244 or concavity extending away from the substrate holder 260, and hence away from the supported substrate 250. The illustrated depression 244 extends in a tubular fashion in the direction into and out of the page, such that the gas flow sees the same gap height along the direction of gas flow.

The upper gas flow control plate 240 is stacked over the lower gas flow control plate 242. A central portion of the upper gas flow control plate 240 is attached to an inner bottom surface of the reactor cover 201. In other embodiments, the gas flow control guide structure 205 may further include additional gas control plates, depending on the number of reactants supplied into the reactor. The gas flow control plates 240 and 242 can be assembled into and detached from the reactor cover 201. This configuration allows easy maintenance and cleaning. In certain embodiments, however, the gas flow control guide structure may be integrally formed with the reactor cover 201 rather than having detachable gas flow control plates described above. The gas flow control guide structure 205 defines a first inflow channel 211, a second inflow channel 213, each of which maintains a separate flow path to the reaction space 251, and an outflow channel 221.

In another embodiment (not shown), a plasma-generating electrode is configured to generate plasma in the reaction space 251 during a deposition process, as disclosed in the incorporated U.S. Publication No. 2006/0249077 A1 at paragraph [0040]. In this case, the electrode can be formed as part of over the lower surface of the lower plate 242, in which case the electrode can serve as the concave ceiling-defining member. The plasma-generating electrode may also or alternatively generate plasma for cleaning the reaction chamber.

Figure 4A:
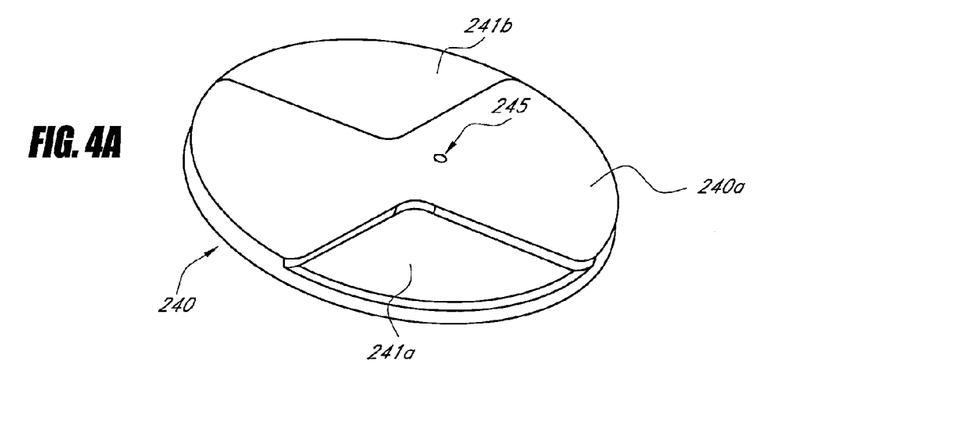
FIGS. 4A and 4B are perspective views of upper and lower gas flow control plates in accordance with the embodiment of FIG. 3.

Referring to FIG. 4A, the upper gas flow control plate 240 has first and second grooves 241a and 241b tapered toward its central portion. In other words, the grooves 241a and 241b widen toward edge portions of the upper gas flow control plate 240 as they extend from the central portion to the edge portions. The illustrated grooves 241a and 241b are in a form of a sector of a circle. The first groove 241a defines a first inflow channel or passage 211 (FIG. 3) with a portion of an inner bottom surface of the reactor cover 201 for the reactant X supplied through the first inlet 210, as shown in FIG. 3. The second groove 241b defines an outflow channel or passage 221 (FIG. 3) with another portion of the inner bottom surface of the reactor cover 201 for excess reactant and reaction by-products, as shown in FIG. 3. The upper gas flow control plate 240 also has a through-hole 245 vertically penetrating the upper gas flow control plate 240. The through-hole 245 is configured to be in fluid communication with the second inlet 212 (FIG. 3) and a groove 246 (FIG. 4B) of the lower gas flow control plate 242 which will be described below. The upper gas flow control plate 240 may be formed of a metallic or ceramic material.

The upper gas flow control plate 240 also includes a solid part 240a between or around the grooves 241a and 241b. The solid part 240a forms sidewalls of the grooves 241a and 241b, and is configured to force the flow outward from the first inlet, around a plate periphery, through the reaction space, around another plate periphery, and inward to the exhaust outlet.

Figure 4B:
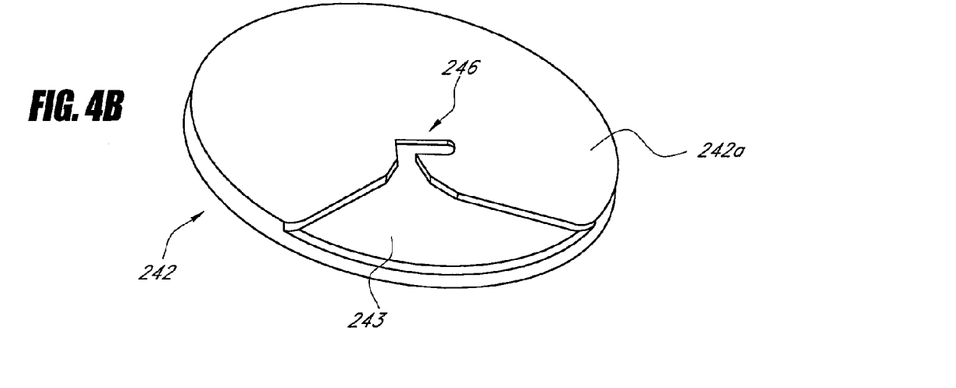

Referring to FIG. 4B, the lower gas flow control plate 242 has a groove 243 tapered toward its central portion. The groove 243 is in a form of a sector of a circle. The groove defines a second inflow channel 213 (FIG. 3) with a lower surface of the upper gas flow control plate 240 for the reactant Y supplied through the second inlet 212, as shown in FIG. 3. Referring back to FIG. 4B, the groove 243 further extends to a central groove 246 of the lower gas flow control plate 242 so that the second inflow channel 213 is in fluid communication with the second inlet 212 via the through-hole 245 of the upper gas flow control plate 240. In addition, a lower surface of the lower gas flow control plate 242 and an upper surface of the substrate holder 260 define the reaction space 251 in which the substrate 250 will be processed. A non-uniform gap between the lower gas flow control plate 242 and the substrate holder 260 may be adjusted to provide an optimal volume. In one embodiment, the non-uniform gap between the lower gas flow control plate 242 and the substrate 250 averages between about 1 mm and about 10 mm. A skilled artisan will appreciate that the shapes and structures of the grooves of the gas flow control plates 240 and 242 may be varied, depending on the design of a reactor.

The lower gas flow control plate 242 also includes a solid part 242a around the grooves 243 and 246. The solid part 242a forms sidewalls of the grooves 243 and 246, forcing the flow outward from the second inlet, around a plate periphery, through the reaction space, around another plate periphery, and inward to the exhaust outlet defined by the upper gas flow control plate 240.

Referring to FIGS. 3 and 4A, the outflow channel 221 defined by the second groove 241b of the upper gas flow control plate 240 narrows as it extends inwardly toward the exhaust outlet 220. Thus, reactant gases may react with each other or be deposited on walls in a bottleneck region B near the exhaust outlet 220 if the gas flow is restricted in the region B. In one embodiment, a cross-sectional area of the exhaust outlet 220 is equal to or greater than a total cross-sectional area of the first and second inlets 210 and 212. In addition, a cross-sectional area of the outflow channel 221 is preferably configured to be equal to or greater than a cross-sectional area of either of the inflow channels 211, 213, and more preferably greater than a total cross-sectional area of the first and second inflow channels 211 and 213. As best seen from FIG. 3, the top plate 203 of the reactor cover 201 is thinner on the exhaust side compared to the inlet side, creating a high-ceilinged outflow channel 221. These configurations alleviate stagnation of the exhaust gases in the bottleneck region B and thus minimize the undesired reaction or deposition.

Figure 5:
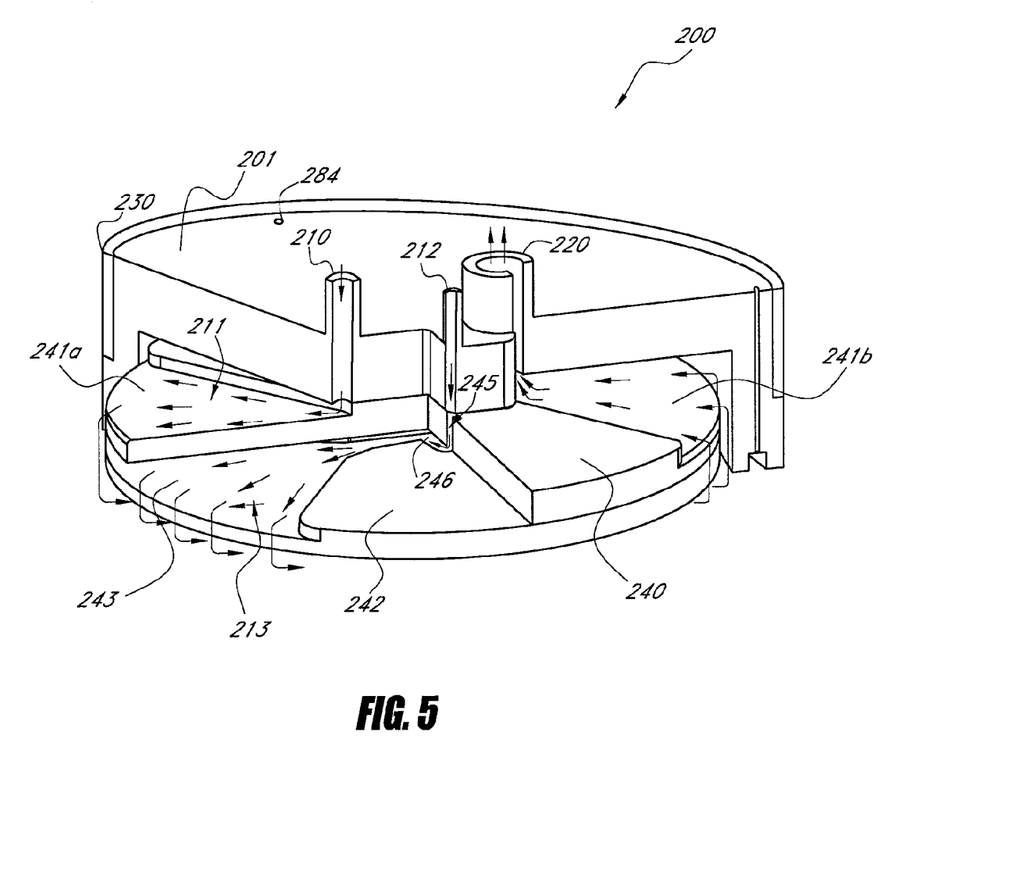
FIG. 5 is a schematic, partially cut-away perspective view of the reactor of FIG. 3.

FIG. 5 illustrates flows of reactants and exhaust gases within the reactor 200 during its operation. At a deposition step, the reactant X is supplied through the first inlet 210 while an inert gas is supplied through the second inlet 212. The reactant X passes through the first inflow channel 211, while being spread into a fanned and flattened flow shape. The reactant X then turns downward at the edge of the upper gas flow control plate 240 toward the upstream periphery of the reaction space. The inert gas flows out from the second inflow channel 213 in a manner similar to that of the reactant X. The inert gas prevents the reactant X from entering the second inflow channel 213. The flow of the reactant X continues toward the reaction space and arrives at the upstream periphery of the reaction space. As shown in FIG. 5, because the grooves 241a and 213 for the reactant X and the inert gas have wide mouths in fluid communication with the reaction space underneath these plates, the reactant X and the inert gas are widely spread when entering the reaction space. This configuration facilitates uniform deposition of the reactant on the substrate 250.

Then, as shown in FIG. 3, the reactant X flows over the substrate 250 in a horizontal direction from the upstream periphery 251a toward the downstream periphery 251b through the reaction space 251. At the downstream periphery 251b, exhaust gases such as excess reactant X, the inert gas, and any reaction by-products, flow upward through a vertical exhaust passage 222 toward the exhaust outlet 220. The exhaust gases flow through the outflow channel 221 and exit through the exhaust outlet 220. As shown, the exhaust outlet 220 has a considerably larger width or diameter than either of the inlets 210, 212, and preferably larger than the sum of their cross-sectional areas.

Referring back to FIG. 5, in a subsequent pulse, the reactant Y is supplied through the second inlet 212 while an inert gas is supplied through the first inlet 210. The reactant Y travels through the vertical through-hole 245 of the upper gas flow control plate 240 and the central groove 246 of the lower gas flow control plate 242 to the second inflow channel 213. Then, the reactant Y continues to flow toward and through the reaction space 251 (FIG. 3) in a manner similar to that of the reactant X described above. The inert gas flowing out from the first inlet channel 211 prevents the reactant Y from entering the first inflow channel 211.

In an exemplary ALD method of depositing a thin film using the reactor 200, the reactant X is supplied through the first inlet 210 while an inert gas is supplied through the second inlet 212. The reactant X is guided by the first inflow channel 211 into the reaction space 251 while being prevented from entering the second inflow channel 213 by the inert gas. This causes the reactant X to be adsorbed onto a substrate 250 positioned in the reaction space 251. The step is preferably conducted for a sufficient period of time to saturate the substrate surface with reactant X. Desirably, the adsorption is self-limiting to no more than a molecular monolayer. Next, excess reactant X and any reaction by-products are purged (or otherwise removed). The preferred purging step is conducted by supplying a purging or inert gas through both of the first and second inlets 210 and 212.

Subsequently, the reactant Y is supplied through the second inlet 212 while an inert gas is supplied through the first inlet 210. The reactant Y is guided by the second inflow channel 213 into the reaction space 251 while being prevented from entering the first inflow channel 211 by the inert gas flowing out from the first inflow channel 211. This causes the reactant Y to react with adsorbed species or fragments of reactant X on the substrate 250. Reactant Y is supplied for a sufficient period of time so that the adsorbed monolayer is completely reacted.

Next, excess reactant Y and any reaction by-products are purged. This purging step is conducted by supplying a purging or inert gas through both of the first and second inlets 210 and 212. Then, if additional deposition is required, the above sequence of steps is repeated in a plurality of cycles. Preferably, the steps are sequentially repeated at least 5 times. Otherwise, the deposition is completed. During the steps described above, the valves located upstream of the inlets 210 and 212 are used to control supplies of the reactants and inert gas.

In another embodiment, an ALD method may start with a non-adsorbing reactant. In certain embodiments, additional reactants may be used for film formation. For example, the substrate surface may be treated with an initial surface treatment agent, e.g., water or other hydroxyl-forming agent, prior to supplying the reactant X into the reaction space. A reducing species may also be used in each cycle to strip ligands, which help make the process self-limiting, from adsorbed species. In addition, additional reactants that contribute to film may be used in each cycle or every few cycles.

In order to conduct the process explained above, the ALD reactor 200 preferably includes a control system. The control system controls the supplies of the reactants and inert gas to provide desired alternating and/or sequential pulses of reactants. The control system can comprise a processor, a memory, and a software program configured to conduct the process. It may also include other components known in the industry. Alternatively, a general purpose computer can be used for the control system. The control system automatically opens or closes valves on the reactant and inert gas lines according to the program stored in the memory.

As noted, the non-uniform gap for a lateral or horizontal flow ALD reactor is preferably used for depositing by ALD on high topography or surface area substrates (e.g., when depositing into high aspect ratio DRAM capacitor structures, such as deep trenches in the substrate). The non-uniform gap is of particular benefit if deposition using reactants with naturally low vapor pressure, as are commonly used in ALD of metallic substances, such as metals, metal oxides, metal nitrides and metal carbides. Reactants can often have vapor pressures, as measured under standard conditions (room temperature and atmospheric pressures) of less than about 0.1 mmHg. Optimal efficiency in use of ALD reactants is particularly important when using such low vapor pressure reactants, because otherwise saturation of high surface (greater than 10 or even greater than 50 times planar surfaces) substrates would take an inordinate amount of time, since it is difficult to deliver sufficient reactants of low vapor pressure.

Figure 4C:
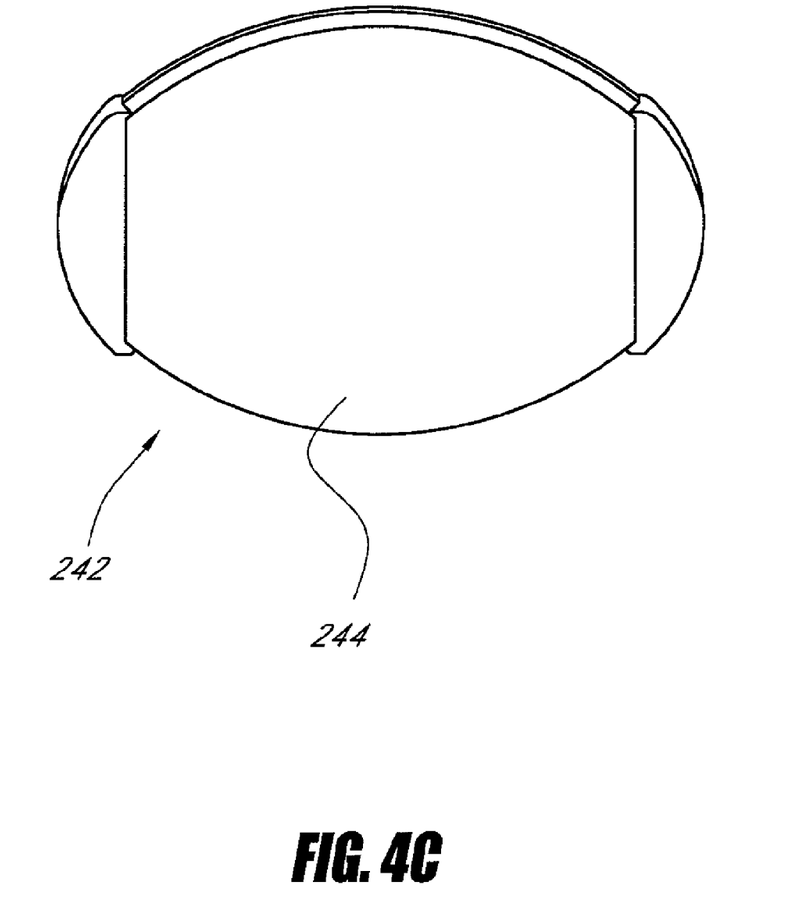
FIG. 4C is a plan view of one example of a lower gas flow control plate that serves as a ceiling-defining member in a reaction chamber of an ALD apparatus according to an exemplary embodiment of the present invention.

FIG. 4C is one example of a lower gas flow control plate 242 included in a reaction chamber of an ALD apparatus according to an exemplary embodiment of the present invention. Referring to FIG. 4C, the reaction chamber of the ALD apparatus according to an exemplary embodiment of the present invention includes a lower gas flow control plate 242. The lower gas flow control plate 242 has a depressed middle portion 244 as shown in FIG. 4C. Accordingly, the reaction chamber does not have a uniform gap at a portion facing a substrate 250 installed therein such that parts corresponding to middle portion of the substrate 250 and the portion adjacent to the middle portion are depressed to have wide spacing from the substrate 250 in the middle portion of the substrate and the regions immediately adjacent to the middle portion. In this way, the reaction chamber, and particularly the reaction space 251 between the gas flow control plate 242 and the substrate 250, has a tunnel- or tubular-shaped gas flowing section and has different heights at a portion facing the middle portion of the substrate 250 and a portion adjacent to the middle portion from other portions, and thereby much more reactant gas may flow on the middle portion of the substrate 250.

In the reaction chamber of the ALD apparatus according to an exemplary embodiment of the present invention, the maximum gap or height of gas-flowing space over a circular substrate can be at least one and a half times that of the minimum gap or height over the substrate. More preferably the maximum gap of space height can be at least two times that of the minimum gap over a circular substrate. The ceiling of the reaction space, which controls the gap height, is defined by the lower gas flow control plate 242 in the embodiment of FIGS. 3-5. The lower gas flow control plate 242 of FIG. 4C can also be provided with a uniformly thick RF electrode conforming to the depression 244. In other cross-flow reactors, such as the reaction chamber of U.S. Pat. No. 6,562,140, an upper plate 9 can include a depression that partially defines the ceiling of the reaction space (see FIG. 3 of the '140 patent).

The minimum gap or space height, preferably near the side edges of the substrate, may be about 0.5 mm to 5 mm, and more preferably about 1 mm to 3 mm in the reaction chamber of the ALD apparatus according to an exemplary embodiment of the present invention. The maximum gap or space height, preferably near the middle of the substrate, and between leading or trailing edges of the substrate with respect to the gas flow, may be about 2 mm to 15 mm, and more preferably about 3 mm to 6 mm in the reaction chamber of the ALD apparatus according to an exemplary embodiment of the present invention.

Figure 6:
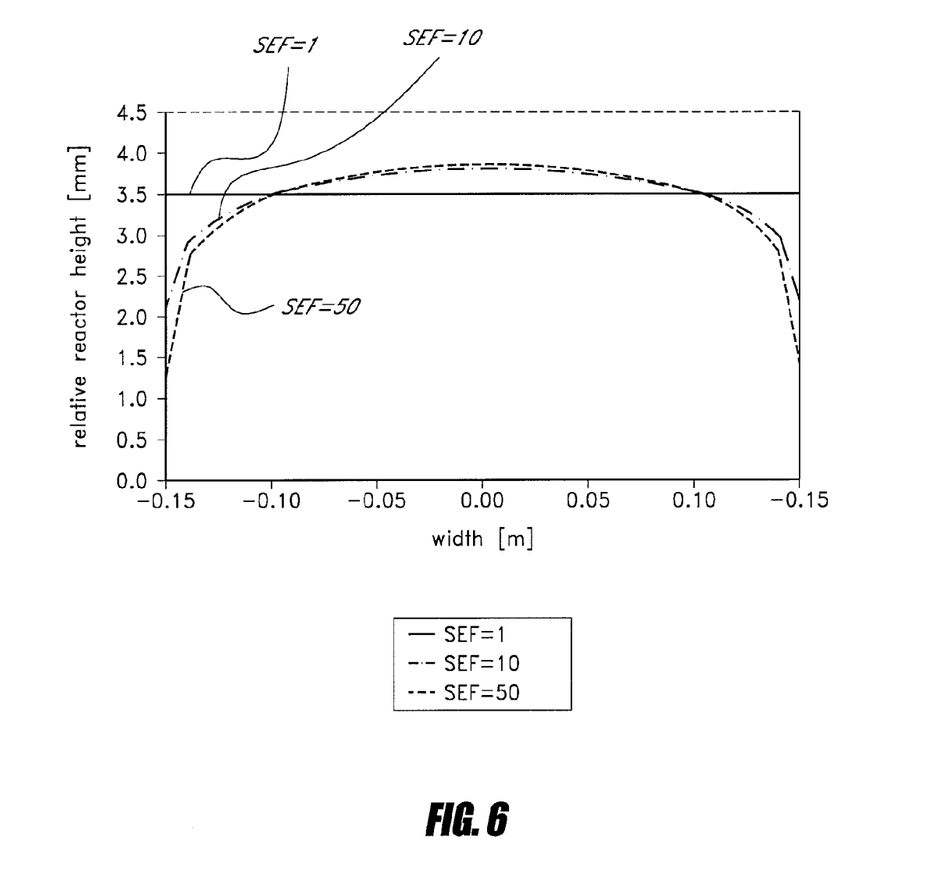
FIG. 6 is a graph representing the dimension of a gap (reactor height) in a reaction chamber of an ALD apparatus according to an exemplary embodiment of the present invention, as a function of position across the width of the substrate perpendicular to the direction of gas flow.

FIG. 6 is a graph representing gap (reactor height) between a circular substrate and a ceiling-defining part of the reaction chamber, such as the lower gas flow control plate 242 shown in FIGS. 3-5, or an RF electrode. In FIG. 6, three cases SEF=1, SEF=10, and SEF=50, are represented such that the case SEF=1 represents a circular substrate having an actual surface area that is the same as a planar substrate, the case SEF=10 represents a circular substrate having an actual surface area that is ten times larger than the planar surface area of a planar substrate, and the case SEF=50 represents a circular substrate having an actual surface area that is fifty times as large as the surface area of a planar substrate.

Now, a difference in gas inflow according to the height difference from the substrate in the reaction chamber will be described in detail.

In the case that gas flows by a difference in pressure between the reaction chamber gas inlet and the gas outlet, the flux of gas is generally proportional to the third power of the gap or height of space through which gas flows if the space has a constant height in the direction parallel to the flow of gas and the space has a different height in the direction perpendicular to the flow of gas. Accordingly, in the reaction chamber of the lateral flow ALD apparatus, the speed of gas flow is faster in portions of gas flow spaces having a greater height from the surface of the substrate, compared to the speed in portions of gas flow space having a low height.

A quantity of gas supply to a circular substrate in the reaction chamber of an ALD apparatus according to an exemplary embodiment of the present invention will be described in detail with reference to FIG. 6.

Referring to FIG. 6, the reaction chamber of the ALD apparatus according to an exemplary embodiment of the present invention includes a lower gas flow control plate (or other ceiling defining member) having a depressed middle portion as shown in FIG. 3 or 4C, such that parts corresponding to the middle portion of the substrate and the portion adjacent to the middle portion are depressed to have larger gap of space height in the middle portion of the substrate and the portion adjacent to the middle portion. "Middle portion" as used here, refers to the central area of the substrate as viewed in a cross-section taken perpendicular to the direction of gas flow, which cross-section is represented by the graph of FIG. 6. In the illustrated embodiment, this cross-sectional height is constant from front to back of the substrate in the direction of gas flow.

As shown in FIG. 6, when a circular substrate having an actual surface area that is at least ten times or fifty times as large as a planar substrate is installed in the reaction chamber according to an embodiment of the present invention, more reactant gas is supplied to the middle portion of the substrate such that the gas flows similarly to the most suitable gas supply flux shown in FIG. 2 in a lateral or cross-flow ALD reaction chamber.

That is to say, the most suitable gas supply flux shown in FIG. 3 may be realized in the reaction chamber of the ALD apparatus according to an embodiment of the present invention including a reaction space ceiling-defining part or member having a depressed middle portion in order to have wide spacing from the substrate in the middle portion of the substrate and the portion adjacent to the middle portion, as shown in FIG. 3 or 4C.

For example, when a thin film is formed on the substrate having an actual surface area that is at least fifty times as large as the surface area of a planar substrate, the gas supply cycle required for depositing the thin film may be completed in the minimum time even though reactant gases are supplied at the minimum quantity required to form the thin film by using the reaction chamber of the ALD apparatus according to an embodiment of the present invention as shown in FIG. 6.

As described above, according to the reaction chamber of the ALD apparatus according to an embodiment of the present invention, when a thin film is formed on a substrate having an actual surface area that is larger than a planar substrate of the same size, the time required for supplying reactant gases and a waste of reactant gases may be reduced to thereby increase productivity of the ALD apparatus.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

We claim:

1. A lateral flow atomic layer deposition (ALD) apparatus in which reactant gas flows in a gas flow direction substantially parallel to the surface of a circular substrate between the surface of the substrate and a side facing the substrate, comprising:
a reaction chamber;
a substrate support configured to support the circular substrate within the reaction chamber; and
a part of the reaction chamber facing the substrate support, the reaction chamber part including a portion depressed away from the substrate support, wherein the reaction chamber part and the substrate support define a gas flow space above the substrate that is not uniform in height across the substrate in a direction perpendicular to the gas flow direction, wherein the gas flow space has a height over a center of the substrate greater than a height over edges of the substrate in a cross-sectional view perpendicular to the gas flow direction, wherein the gas flow space has substantially the same height in a gas flow path along the gas flow direction, wherein the height over the center and the height over the edges are such that a maximum gas flow over the substrate is over the center, and a minimum gas flow rate over the substrate is over the edges.

2. The ALD apparatus of claim 1, wherein the depressed portion of the reaction chamber part corresponds to a middle portion of the substrate support.

3. The ALD apparatus of claim 1, wherein a maximum height of the gas flow space over the substrate is at least one and half times higher than a minimum height thereof.

4. The atomic layer reaction apparatus of claim 3, wherein the maximum height of the gas flow space over the substrate is at least two times higher than the minimum height thereof.

5. The ALD apparatus of claim 1, wherein a minimum height of the gas flow space over the substrate flow is within about 0.5 mm to about 5 mm.

6. The ALD apparatus of claim 5, wherein the minimum height of the gas flow space over the substrate is within about 1 mm to about 3 mm.

7. The ALD apparatus of claim 1, wherein a maximum height of the gas flow over the substrate is within about 2 mm to about 15 mm.

8. The ALD apparatus of claim 7, wherein the maximum height of the gas flow space over the substrate is within about 3 mm to about 6 mm.

9. The ALD apparatus of claim 1, wherein the reaction chamber part is a gas flow control plate at least partially defining a gas inlet for the reaction chamber.

10. The ALD apparatus of claim 1, comprising at least two separate gas inlets to the reaction chamber.

11. The ALD apparatus of claim 1, wherein the reaction chamber part comprises an RF electrode for generating plasma within the reaction space.

* * * * *